US006815790B2

(12) United States Patent
Bui et al.

(10) Patent No.: US 6,815,790 B2
(45) Date of Patent: Nov. 9, 2004

(54) POSITION SENSING DETECTOR FOR THE DETECTION OF LIGHT WITHIN TWO DIMENSIONS

(75) Inventors: Peter S. Bui, Westminster, CA (US); Narayan Dass Taneja, Long Beach, CA (US)

(73) Assignee: Rapiscan, Inc., Hawthorne, CA (US)

( * ) Notice: Subject to any disclaimer, the term of this patent is extended or adjusted under 35 U.S.C. 154(b) by 48 days.

(21) Appl. No.: 10/340,565

(22) Filed: Jan. 10, 2003

(65) Prior Publication Data

US 2004/0135224 A1 Jul. 15, 2004

(51) Int. Cl.$^7$ .................. H01L 31/0224; H01L 31/105; H01L 31/0304
(52) U.S. Cl. .............. 257/459; 257/129; 257/458; 257/466
(58) Field of Search ................. 257/184, 189, 257/458, 459, 461, 466

(56) References Cited

U.S. PATENT DOCUMENTS

| | | | |
|---|---|---|---|
| 4,874,939 A | * 10/1989 | Nishimoto et al. | ......... 257/466 |
| 4,887,140 A | * 12/1989 | Wang | ........... 257/458 |
| 4,904,608 A | 2/1990 | Gentner et al. | |
| 5,144,379 A | 9/1992 | Eshita et al. | |
| 5,214,276 A | 5/1993 | Himoto et al. | |
| 5,252,142 A | 10/1993 | Matsuyama et al. | |
| 5,446,751 A | 8/1995 | Wake | |
| 5,576,559 A | 11/1996 | Davis | |
| 5,599,389 A | 2/1997 | Iwasaki | |
| 5,818,096 A | 10/1998 | Ishibashi et al. | |
| 5,825,047 A | 10/1998 | Ajisawa et al. | |
| 5,923,720 A | 7/1999 | Barton et al. | |
| 6,218,684 B1 | 4/2001 | Kuhara et al. | |
| 6,326,649 B1 | 12/2001 | Chang et al. | |
| 6,352,517 B1 | 3/2002 | Flock et al. | |
| 6,438,296 B1 | 8/2002 | Kongable | |
| 6,489,635 B1 | 12/2002 | Sugg | |
| 2002/0056845 A1 | 5/2002 | Iguchi et al. | |

FOREIGN PATENT DOCUMENTS

| | | |
|---|---|---|
| EP | 0 347 157 A2 | 12/1989 |
| EP | 0 723 301 A3 | 5/1997 |
| EP | 0 723 301 B1 | 7/2000 |
| EP | 1 069 626 A2 | 1/2001 |
| EP | 1 205 983 A1 | 5/2002 |
| WO | WO/00/52766 | 9/2000 |

* cited by examiner

*Primary Examiner*—Gene M. Munson
(74) *Attorney, Agent, or Firm*—PatentMetrix

(57) ABSTRACT

The present invention improves the resolution and accuracy of the presently known two-dimensional position sensing detectors and delivers improved performance in the 1.3 to 1.55 micron wavelength region. The present invention is an array of semiconductor layers with four electrodes, the illustrative embodiment comprising a semi-insulating substrate semiconductor base covered by a semiconductor buffered layer, the buffered layer further covered by a semiconductor absorption layer and the absorption layer covered with a semiconductor layer. Four electrodes are placed on this semiconductor array: two on the top layer parallel to each other and near the ends of opposite edges, and two etched in the buffered layer, parallel to each other and perpendicular to the first set. The layers are doped as to make a p-n junction in the active area. Substantially all the layers, excepting the semi-insulating substrate layer, are uniformly resistive.

24 Claims, 8 Drawing Sheets

POSITION SENSING DETECTOR FOR THE DETECTION OF LIGHT WITHIN TWO DIMENSIONS

FIELD OF THE INVENTION

The present invention relates generally to the field of position sensing detectors, and more specifically, to a type of duo-lateral semiconductor based position sensing detector photodiode.

BACKGROUND OF THE INVENTION

Detection of the position of incident light is crucial to, among other things, systems used for movement monitoring, mirror alignment, optical switches, optical remote control, lens reflection and refraction measurements, distortion and vibration measurements, position and angle sensors, optical range finders, laser displacement sensors, and auto focusing schemes for machine tool alignment and cameras. Various instruments like small discrete detector arrays or multi-element sensors are available for detecting the position of incident light. However, photodiode-based position sensing detectors (PSDs) offer higher position resolution, higher speed response and greater reliability than other solutions. These photodiode based position sensing detectors are made from semiconductors such as silicon materials.

Since silicon has a cut-off wavelength of 1.1 micron, silicon materials are not useful for longer wavelength applications, such as in the 1.3 to 1.55 micron range for communication systems. This range of wavelength is particularly essential for infrared detection, and microscopic spot light detection, among others. Therefore, position sensing detectors employing materials other than silicon, such as indium-gallium-arsenide (InGaAs)/indium-phosphide (InP), which have a cut-off wavelength suitable for photo detection in the 1.3 to 1.55 micron range, have been developed.

Position sensing detectors utilizing InGaAs/InP are available and are classified primarily into two types: one-dimensional and two-dimensional. One-dimensional position sensing detectors are more limited in application than two-dimensional position sensing detectors, since they can only detect movement in one direction. Two-dimensional position sensing detectors are broadly divided into duo-lateral and tetra-lateral types. While, in general, the former suffers primarily from limitations like high dark current, low speed response and complicated application of reverse bias, the latter primarily suffers from low position resolution and lower signal currents.

Therefore there is a need for innovation in the two-dimensional position sensing detectors to improve the afore-mentioned limitations leading to higher accuracy position sensing.

SUMMARY OF THE INVENTION

The present invention improves the resolution and accuracy of the presently known two-dimensional position sensing detectors. Another object of the present invention is to deliver high performance in the 1.3 to 1.55 micron wavelength region.

In a first aspect of the invention, a position sensing detector includes a semi-insulating substrate semiconductor base covered by first and second semiconductor layers. A p-n junction is created between the first and second semiconductor layer. The detector includes a first pair of electrodes electrically coupled to the first semiconductor layer and a second pair of electrodes electrically coupled to a second semiconductor layer.

The second pair of electrodes may be disposed perpendicular to the first pair of electrodes. One of the electrodes of a first pair of electrodes may be a conductor filled trench extending to the first semiconductor layer through the second semiconductor layer. The trench has a passivation layer covering at least part of the trench wall. The first and second pairs of electrodes may further extend substantially to a common plane. The substrate may be InP.

In a second aspect of the invention, a position sensing detector includes a semi-insulating semiconductor substrate, a first semiconductor layer over the substrate, a second semiconductor layer over the first semiconductor layer, and a third semiconductor layer over the second semiconductor layer. The detector further includes a first and second pairs of electrodes disposed perpendicular to each other and a p-n junction between the second and third semiconductor layers.

The third semiconductor layer may be treated to form a p-region to create the p-n junction. The first and second pairs of electrodes may extend substantially to a common plane. The second aspect may have a second semiconductor layer cover part of the first semiconductor layer and be disposed between the first pair of electrodes that are coupled to the first semiconductor layer. Further, the first semiconductor layer may cover part of the substrate. The position sensing detector may also include a conductive extension that is electrically coupled to an electrode and routed to the substrate. The substrate may be InP and the semiconductor layers may be InGaAs or InGaAs/InP.

Operationally, the position sensing detectors are reverse biased. Photovoltaic effect causes generation of p-type and n-type charges, which move toward the p-type and n-type electrodes respectively, thereby causing a current. The currents received at each electrode are measured and point of incidence is determined.

BRIEF DESCRIPTION OF THE DRAWINGS

These and other features and advantages of the present invention will be appreciated, as they become better understood by reference to the following detailed description when considered in connection with the accompanying drawings.

DETAILED DESCRIPTION OF THE INVENTION

The present invention is a novel position sensing detector capable of detecting light, particularly within the 1.3 to 1.55 micron range, and has improved position sensing within two dimensions. The present invention will be described with reference to the aforementioned drawings. One of ordinary skill in the art would appreciate that the application described herein is exemplary of the broader concept of the present invention.

The present invention comprises a novel chip structure that may be applied to other fields of use and may be implemented using various materials. In an illustrative embodiment, the chip structure includes a semi-insulating substrate, a buffered layer, an absorption layer, and a cap layer. The chip further includes a first pair of electrodes electrically coupled to the buffered layer, and a second pair of electrodes disposed perpendicular to the first pair of electrodes electrically coupled to the cap layer. This structure may be implemented using, individually or in combination, silicon, gallium-arsenide, indium-gallium-arsenide, indium-phosphide, germanium, mercury-cadmium-telluride layers, or other suitable semiconductor materials. Further, this structure may be implemented wherein the semiconductor layers are p-type doped or n-type doped, and diffused as appropriate.

Figure 1:
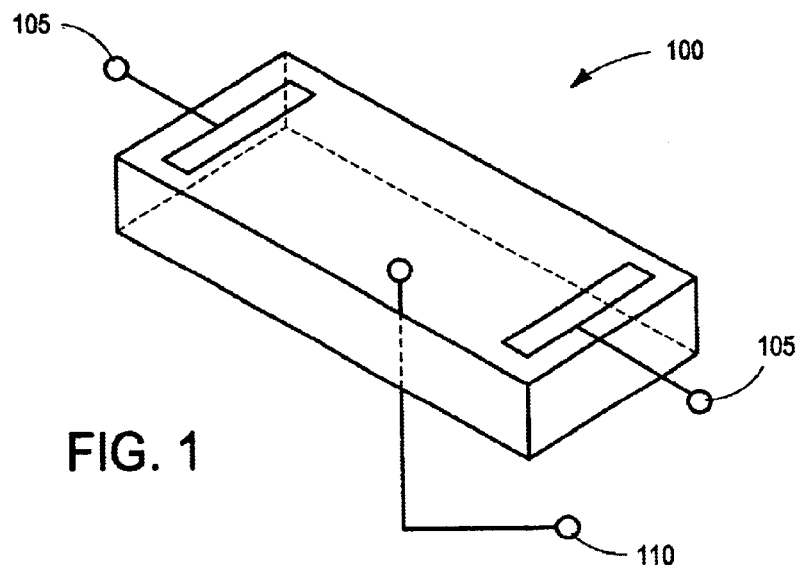
FIG. 1 is a perspective view of a one-dimensional position sensing detector.

In a preferred embodiment, the present structure is implemented on InGaAs/InP. Implementing InGaAs/InP is particularly suitable for detecting wavelengths in the range of 1.3 to 1.55 microns while providing high resolution. FIG. 1 shows a perspective view of a prior art one-dimensional position sensing detector 100. The position sensing detector 100 consists of a uniform resistive layer formed on one or both surfaces of a high-resistivity semiconductor substrate. The active area has a p-n junction that generates currents, by means of photovoltaic effect, which act as signals. A pair of electrodes 105a, 105b is formed on both ends of top resistive layer, in conjunction with a single electrode 110 at the bottom layer, for extracting these position signals.

Figure 2:
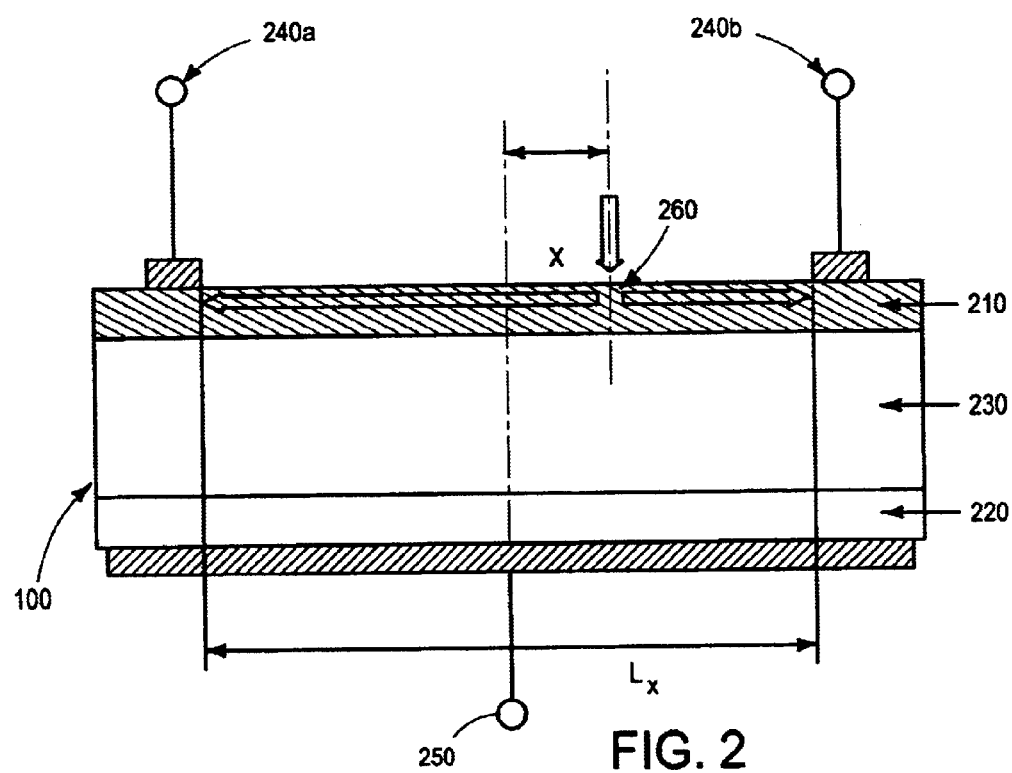
FIG. 2 is a cross-section view of a one-dimensional position sensing detector of FIG. 1.

Referring now to FIG. 2, the position sensing detector 100 has a p-type resistive layer 210 formed on top of an n-type silicon substrate 220. The p-layer 210 serves as an active area for photoelectric conversion and a pair of output electrodes 105a and 105b is formed on both ends of the p-layer. The n-type layer 220 on the backside of the silicon substrate is connected to a common electrode 110. The area between p and n layers is the i-layer 230, and the diode is also known as p-i-n diode. It may be noted that a position sensing detector may also be formed by inverting the abovementioned structure (replacing p-type by n-type).

Figure 3:
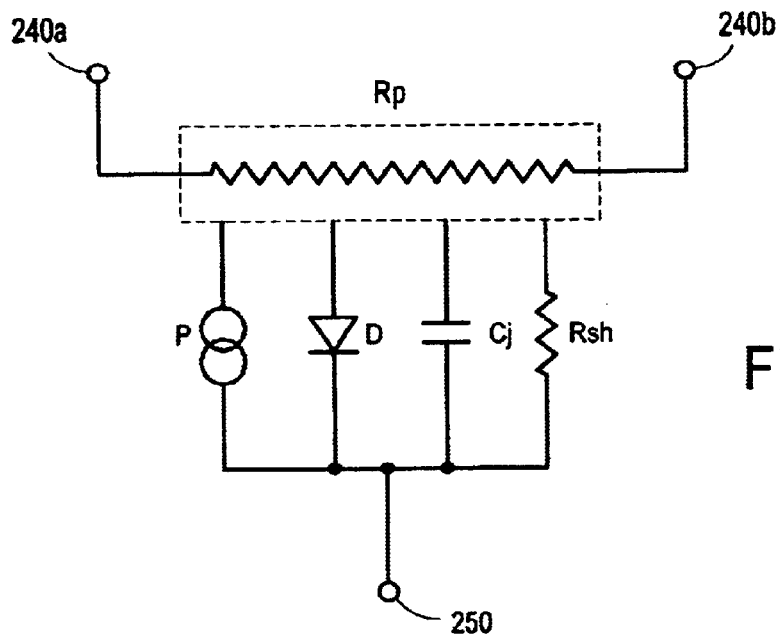
FIG. 3 shows an equivalent circuit of the one-dimensional position sensing detector of FIG. 1.

Operationally, on the incidence of a light spot on the position sensing detector 100, an electric charge proportional to light intensity is generated at the incident position 260. This electric charge is composed of p-type and n-type carriers. The position sensing detector is reverse biased under operation and p-type charges are driven to the p-layer electrodes 105a and 105b, whereas n-type charges are driven to the n-layer electrode 110. These charges are driven through the resistive layers 210 and 220 and collected by the output electrodes to constitute photocurrents. The charge carriers of the top layer (p-type charges) are divided into currents that flow to the two electrodes 105a and 105b on different ends of the p-layer 210. The currents $I_{x1}$ and $I_{x2}$ collected at each of the two electrodes are inversely proportional to the distance between the incident position of light and each electrode. The relation between the incident light position and the photocurrents from the output electrodes 105a and 105b is given by equation (1):

$$(I_{x2}-I_{x1})/(I_{x2}+I_{x1})=2x/L_x \qquad (1)$$

where x is the distance of the light spot from the center of the position sensing detector and $L_x$ is the interelectrode spacing. The currents $I_{x1}$ and $I_{x2}$ are measured and the position of the light input, x, is obtained. The equivalent circuit of this position sensing detector is shown in FIG. 3. The positioning resistance, Rp, corresponds to the resistance of the uniformly resistive top p-layer, P is the current generator, D is an ideal diode, Cj is the junction capacitance, and Rsh is the shunt resistance.

Prior art two-dimensional photodiodes have two sets of electrodes for resolving the currents to detect the position of incident light in two dimensions, X and Y. Each set of electrodes may be two parallel conducting bars, placed at suitable distances, in ohmic contact with the diode. The two sets are placed perpendicular to each other, may both be on the top surface or one set each on the top and bottom surface of the diode, known as tetra-lateral and duo-lateral types respectively.

Figure 4:
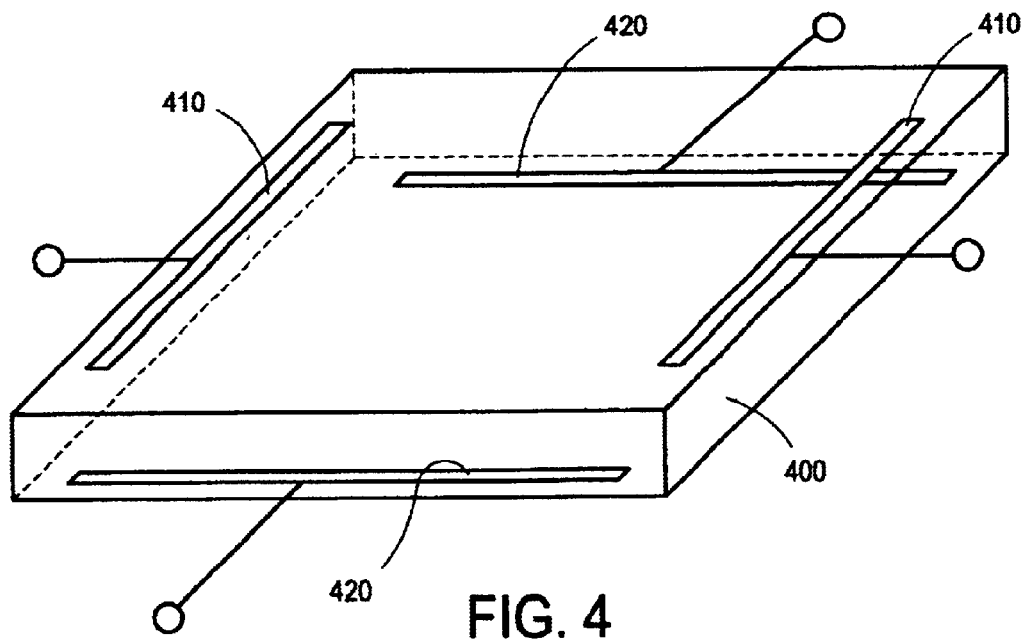
FIG. 4 shows a duo-lateral type position sensing detector.
Figure 5:
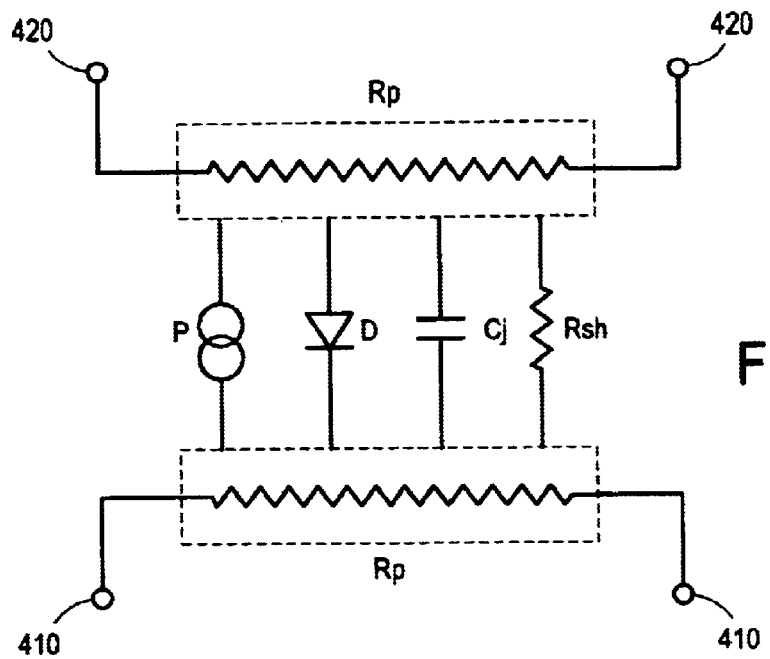
FIG. 5 shows an equivalent circuit of the duo-lateral position sensing detector of FIG. 4.

FIG. 4 shows a duo-lateral type position sensing detector 400, with one set of electrodes 410, functioning as anodes, on the top layer and another set of electrodes 420, functioning as cathodes, below the bottom layer. FIG. 5 shows the equivalent circuit of the duo-lateral position sensing detector 400. Two positioning resistances Rp correspond to the top and bottom uniformly resistive layers, P is the current generator, D is the ideal diode, Cj is the junction capacitance, and Rsh is the shunt resistance.

Figure 6:
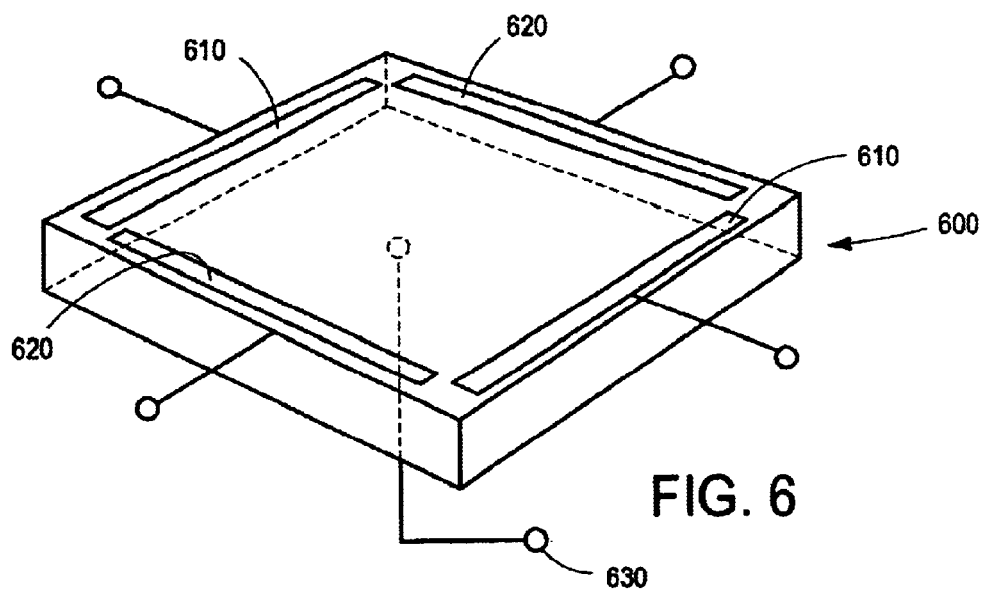
FIG. 6 shows a tetra-lateral type position sensing detector.
Figure 7:
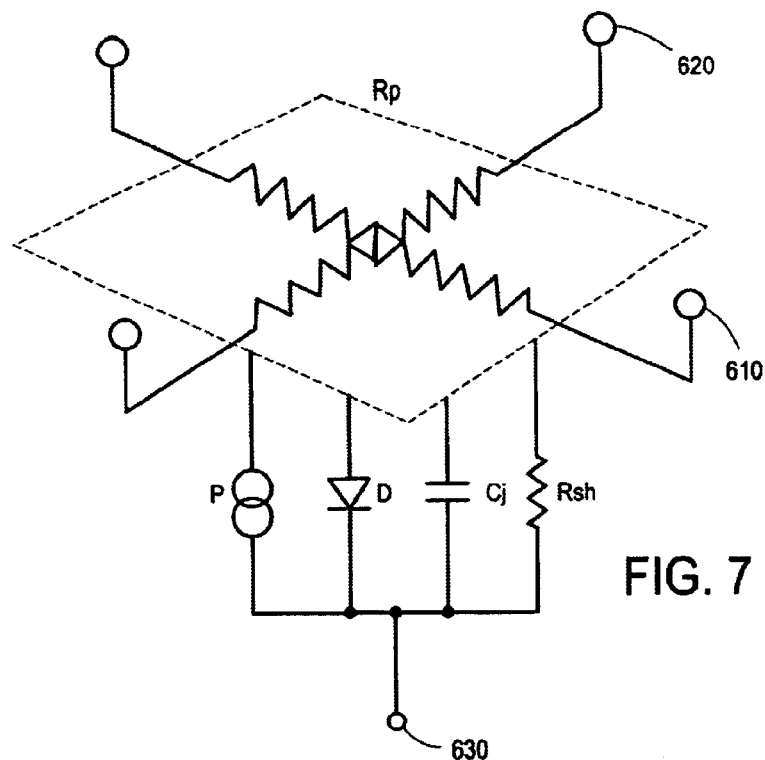
FIG. 7 shows an equivalent circuit of a tetra-lateral position sensing detector of FIG. 6.

Tetra-lateral type position sensing detector 600, shown in FIG. 6 has both sets of electrodes 610 and 620 on the top layer functioning as anodes, and a common electrode 630, functioning as a cathode at the bottom layer. FIG. 7 shows the equivalent circuit of the tetra-lateral position sensing detector 600. The two positioning resistances Rp correspond to the resolution of the current generated in the uniformly resistive top layer into two directions by the electrode sets 610 and 620, P is the current generator, D is the ideal diode, Cj is the junction capacitance, and Rsh is the shunt resistance.

The position detection method is similar to the one-dimensional position sensing detectors; the charges are resolved into currents by the electrodes and a measure of these currents determines the position of the incident light. However, these two-dimensional position sensing detectors suffer from limitations as discussed earlier.

Figure 8:
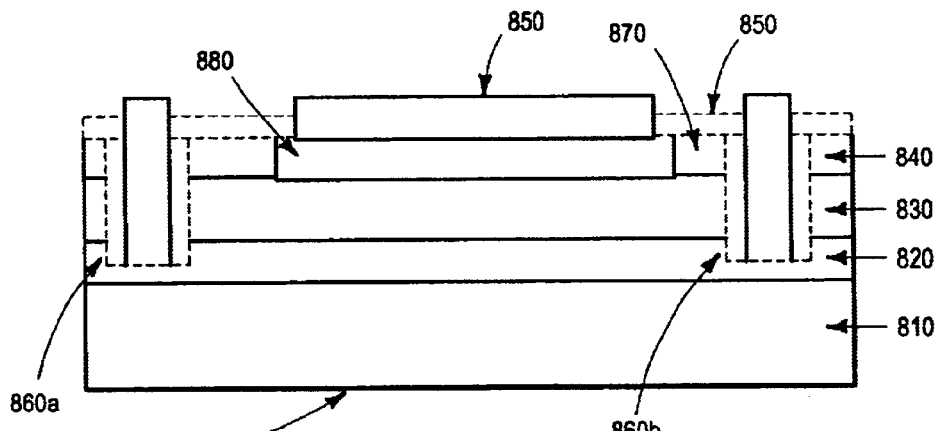
FIG. 8 is a cross-sectional view of a position sensing detector according to the present invention.

FIG. 8 shows a cross-sectional view of a two-dimensional position sensing detector 800 in accordance with the present invention. In a particular embodiment, an InP buffered layer 820 is formed over a semi-insulating substrate layer 810. An InGaAs absorption layer 830 is formed over the buffered layer 820, and an InP cap layer 840 is formed over the absorption layer 830. Two pairs of output electrodes that correspond to the two dimensions X and Y are used. A first pair of electrodes 860a and 860b is electrically coupled to the InP buffered layer 820, and function as cathodes. Electrodes 860a, 860b are parallel to each other and are each disposed near opposite ends of the PSD 800. A second pair of electrodes 850a, 850b (850b not visible in FIG. 8) is electrically coupled to the p-type region 880 of the InP layer 840 and function as anodes. Electrodes 850a, 850b are disposed near opposite ends of the p-type region 880 of the InP layer 840 and are disposed perpendicular to the first pair of electrodes 860a, 860b.

The semi-insulating substrate layer 810 is preferably a 50 micron to 1000 micron thick InP or other suitable material. The buffered layer 820 is n-type doped having a thickness in a range of 0.1 micron to 1.0 micron and a doping concentration in a range of $1\times10^{15}$ atoms per cc to $1\times10^{18}$ atoms per cc. The absorption layer 830 is n-type doped having a thickness in a range of 1 to 6 microns and having a doping concentration in a range of $1\times10^{13}$ atoms per cc to $1\times10^{16}$ atoms per cc. The cap layer 840 is n-type doped having a thickness in a range of 0.1 micron to 2 micron and a doping concentration in a range of $1\times10^{14}$ atoms per cc to $1\times10^{17}$ atoms per cc.

The InGaAs layer 830 functions as the i-layer. An anti-reflective layer 870, such as for example, silicon nitride, is preferably positioned over the InP layer 840 as a means to control reflection and to passivate the surface of the junction. To create a p-n junction, an area on the cap layer 840 is diffused with, for example, zinc, to make the p-type region 880 having a concentration in a range of $1\times10^{16}$ atoms per cc to $1\times10^{19}$ atoms per cc. Preferably, the concentration of the p-type region is at least $1\times10^{18}$ atoms per cc. At the junction of the p-type region 880 and the n-type doped semiconductor layer 830, a p-n junction is formed.

Although the preferred embodiment includes an InP layer 840, this layer is not necessary. If InP layer 840 is not used, the p-type region 880 may be created by diffusing, for example, zinc to the InGaAs layer 830. However, implementing InP layer 840 is preferred as it operates to keep surface dark current low. Further, the buffered layer 820 and cap layer 840 may be InGaAs instead of InP as illustrated in FIG. 8.

Figure 9:
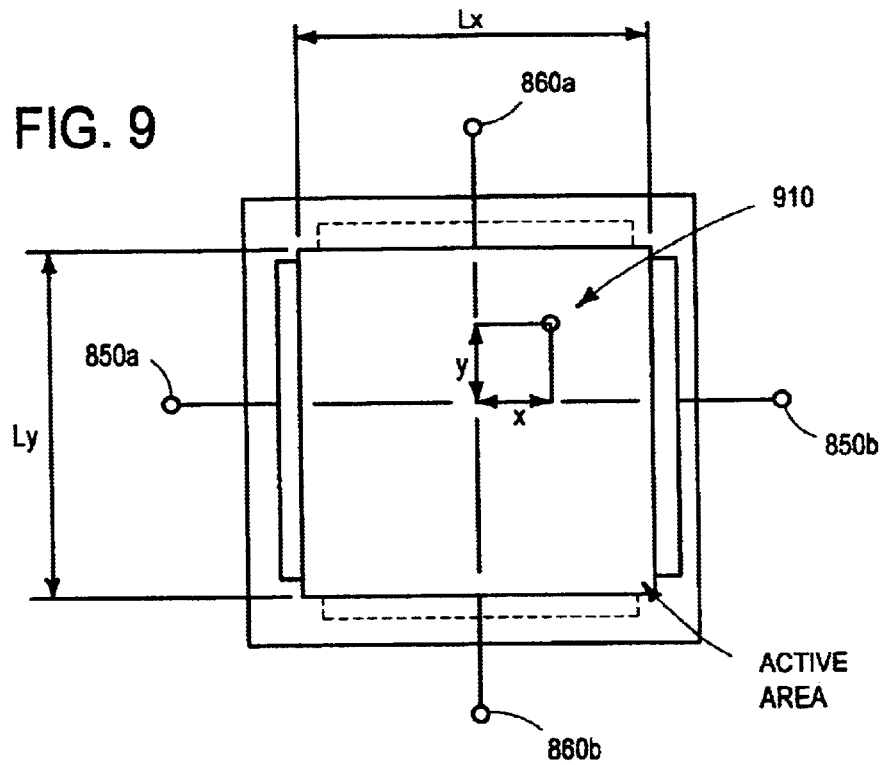
FIG. 9 is a top view diagram of the active area of the position sensing detector of FIG. 8.

Referring now to FIG. 9, the top view of an active area 915 of PSD 800 is shown. On incidence of a light spot 910 on the active area, photocurrent generated is extracted by both sets of electrodes 850a, 850b and 860a, 860b. The top electrodes 850a and 850b extract $I_{x1}$ and $I_{x2}$, and the etched electrodes 860a and 860b extract $I_{y1}$ and $I_{y2}$ respectively. Values of these currents are used to determine the coordinates of the light spot based on equations (2) and (3).

$$X=[(I_{x2}-I_{x1})/(I_{x2}+I_{x1})]*L_x/2 \quad (2)$$

$$Y=[(I_{y2}-I_{y1})/(I_{y2}+I_{y1})]*L_y/2 \quad (3)$$

In the above formulas, X and Y are the distances from the center of the position sensing detector to the light spot, $L_x$ and $L_y$ are the inter-electrode spacings of the electrode pairs in the X and Y directions. Referring back to FIG. 5, the equivalent circuit is provided wherein the two positioning resistances Rp correspond to the top and bottom uniformly resistive layers, P is the current generator, D is the ideal diode, Cj is the junction capacitance, and Rsh is the shunt resistance.

Figure 10:
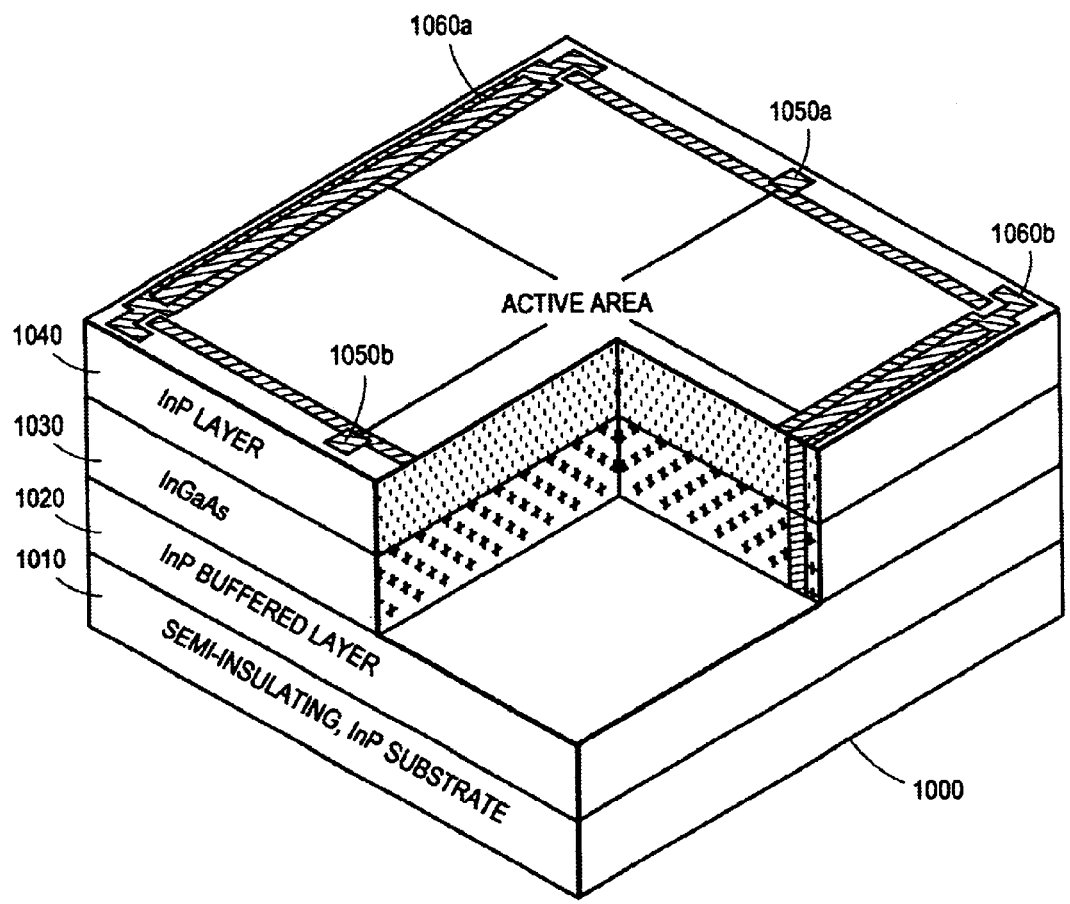
FIG. 10 is a perspective view of a position sensing detector of FIG. 8.

FIG. 10 shows a perspective view of PSD 800. The 0.1 to 1 micron thick InP buffered layer 820 is formed on a semi-insulating InP substrate 810 of thickness between 50 to 1000 microns. An InGaAs absorption layer 830, 1 to 6 microns thick, is formed on the InP buffered layer 820. An InP layer 840 of thickness 0.1 to 2 microns is formed over the InGaAs absorption layer 830. All the layers above the substrate layers are doped with n-type doping. A region of the top layer 840, known as the mask region, is diffused with zinc to make a p-type region, thereby forming a p-n junction between the InP layer 840 and the InGaAs absorption layer 830. Two longitudinal electrodes 850a, 850b of p-type material, such as AuBe, Ti, Au, or Cr/Au, in ohmic contact with the p-type region of the InP layer 840 are formed on the top of the layer so that each electrode is near the opposing edge of the top layer 840. Two longitudinal electrodes 860a, 860b of n-type material, such as AuGe, Au, or Cr/Au, are deposited into a dielectric passivated trench extending to the InP buffered layer 820, thereby making an ohmic contact with the n-type buffered layer. These two electrodes are formed near the opposing edges that are perpendicular to the edges of p-type electrodes. The walls of the trench are passivated with a passivation layer 815 comprised of, for example, silicon nitride as illustrated in FIG. 8. A suitable conducting material, such as Cr/Au, fills up the trench formed by etching, and metal pads 1070 are placed for making electrical contacts. To facilitate easy assembly of the device, the first and second pairs of electrodes extend to the top of the InP layer 840. Thus, the p-metal electrodes and the n-metal electrodes are on the same surface. It is preferred that the same surface height be provided to enable flip chip assembly.

Operationally, the diode is reverse biased, causing a depletion region to extend through the InGaAs intrinsic layer and reach the n-buffered layer. On the incident of a light spot on the position sensing detector, the light reaches the InGaAs absorption layer 830, where it is absorbed and charge carriers (holes and electrons) are generated by the virtue of photovoltaic effect. The p-type carriers drift towards the top InP layer 840 and flow into the anodes 850a and 850b as $I_{x1}$ and $I_{x2}$ respectively, the n-type carriers drift towards the InP substrate layer 810 and are collected by the cathodes 860a and 860b as $I_{y1}$ and $I_{y2}$ respectively. The currents collected are measured and the position is determined.

Figure 11:
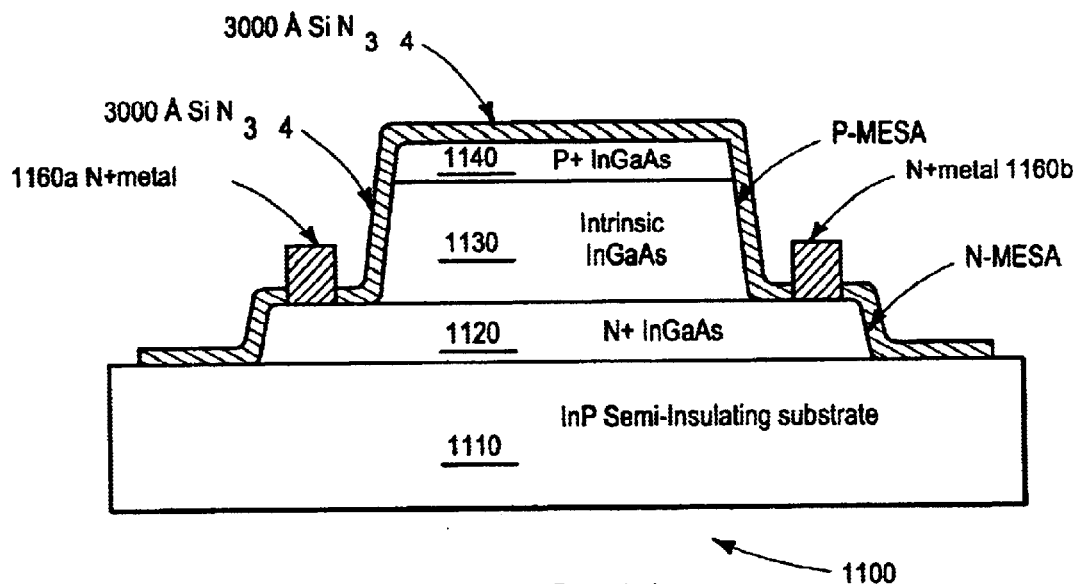
FIG. 11 is a cross-section view of a position sensing detector according to the second embodiment of the present invention.

In a second embodiment of the present invention shown in FIG. 11, a position sensing detector 1100 consists of an p-i-n type InGaAs layer 1120 formed over an InP semi-insulating substrate 1110. P-type doping from the top of InGaAs layer results in the formation of p-type layer 1140 and i-type InGaAs layer 1130 on top the n-type layer 1120, as shown. The layered structure is then mesa-etched and deposited with a passivation layer 1170. Preferably, the passivation layer is comprised of a composition that may also function as an anti-reflection layer, such as silicon nitride. P-type metal electrode 1150a and 1150b are placed on the p-type InGaAs layer 1140, and n-type metal electrodes 1160a and 1160b are placed on the n-type InGaAs layer 1120.

In a preferred embodiment, the semi-insulating substrate 110 is 50–1000 microns; the n-type doped InGaAs layer 1120 has a thickness in a range of 0.1 micron to 1.0 micron and a doping concentration in a range of $1\times10^{15}$ atoms per cc to $1\times10^{18}$ atoms per cc; the InGaAs intrinsic layer 1130 has a thickness in a range of 1 to 6 microns and a doping concentration of $1\times10^{13}$ atoms per cc to $1\times10^{16}$ atoms per cc; and the p-type InGaAs layer 1140 has a thickness of 0.1–2 micron and a doping concentration of $1\times10^{16}$ atoms per cc to $1\times10^{19}$ atoms per cc.

This alternative embodiment provides several benefits. This embodiment costs less to manufacture because the p-i-n InGaAs layers are grown epitaxially and there is no extra planar zinc diffusion step on this structure. Additionally, it is better suited for applications where the assembly does not require all four electrodes to be on the same surface, i.e. for wirebonding, while embodiments having all four electrodes on the same surface are more appropriate for other applications, such as flip chip assemblies.

Although the embodiment illustrated in FIG. 11 comprises an InGaAs p-type layer 1140 and an InGaAs n-type layer 1120, an InP p-type layer and InP n-type layer may also be employed. Further, PSD 1100 may be formed by inverting the structure, i.e., exchanging the p-type layer 1140 and the n-type layer 1120.

Figure 12:
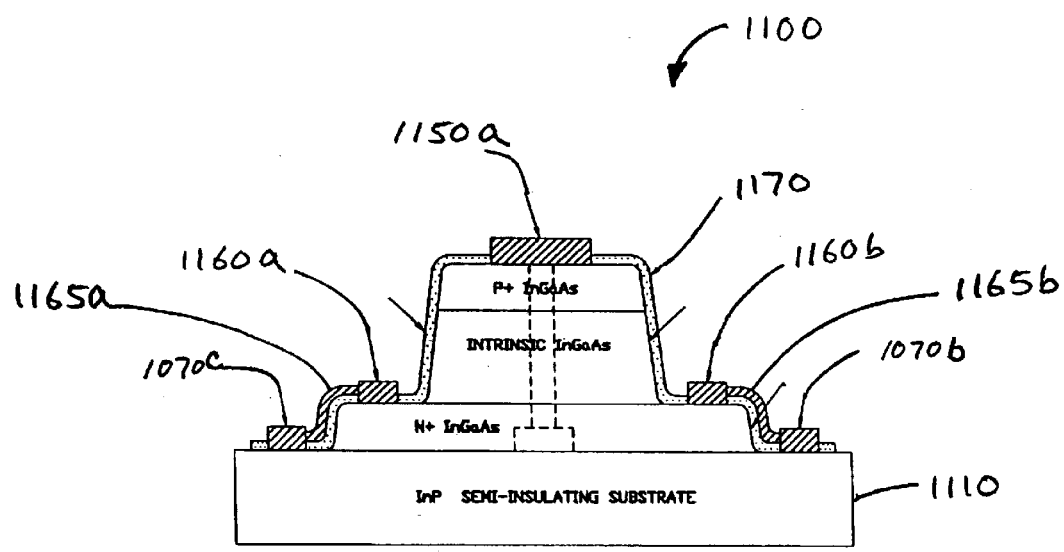
FIG. 12 is a cross section view of a position sensing detector of FIG. 11 including conductive extensions.
Figure 13:
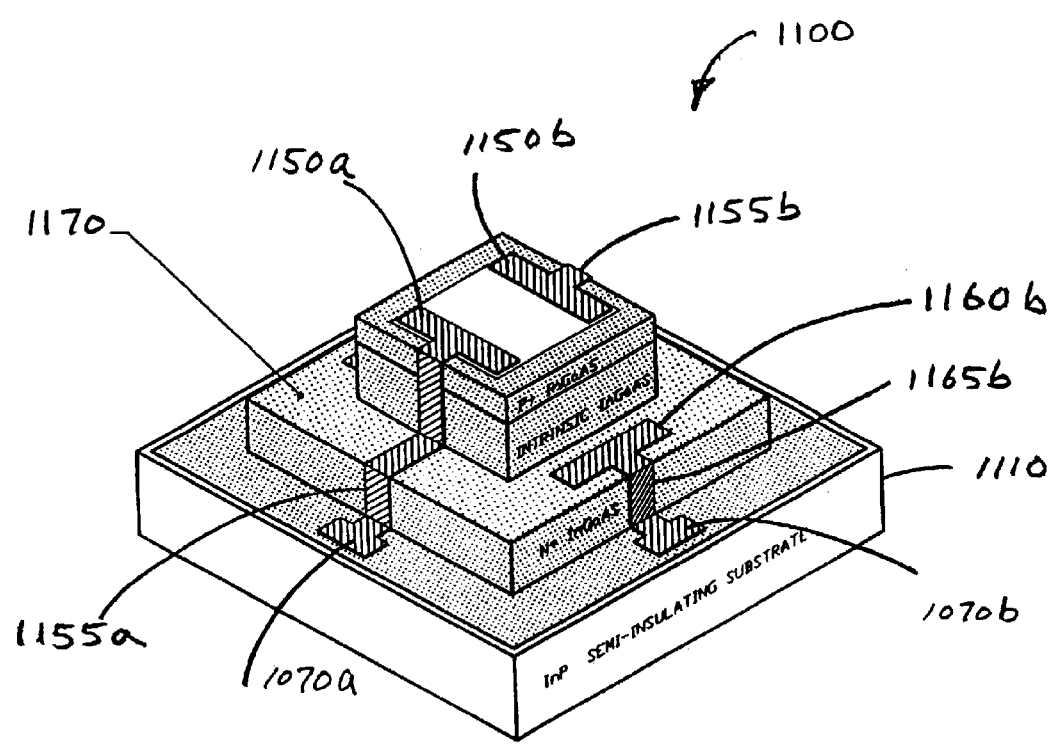
FIG. 13 is a perspective view of a position sensing detector of FIG. 12.

Referring to FIGS. 12 and 13, the position sensing detector 1100 may further include conductive extensions 1155a, 1155b, 1165a, 1165b. The conductive extensions 1155a, 1155b, 1165a, 1165b each serve to facilitate connecting the position sensing detector 1100 to other electronic devices by providing contacts to a more accessible location. In the illustrative embodiment shown in FIG. 12, conductive extension 1165b is electrically coupled to electrode 1160b and routed over the passivation layer 1170 to a contact pad 1070b located on top of the semi-insulating substrate 1110. The conductive extension and contact pad may be deposited on the passivation layer 1170. Suitable conductive extension material includes gold. In a similar manner, conductive extensions 1155a, 1155b, 1165a, are coupled to electrodes 1150a, 1150b, 1160a, respectively, and are each routed to separate contact pads 1070a, 1070c, 1070d(1070d not visible in FIGS. 12 and 13) located on top of the semi-insulating substrate. By providing the PSD contacts that are displaced from the electrodes 1150a, 1150b, 1160a, 1160b, electrically connecting the PSD to other devices may be simplified and improved.

Preferably, as shown in FIG. 12, the contact pads are located on a common plane. Such a configuration improves access during, for example, a wire-bonding process. However, the conductive extensions may be routed to any position or layer as desired. Further, although the conductive extension is illustrated as a rectangular configuration, any suitable configuration and routing that maintains electrical connection between an electrode and a contact pad may be employed.

The present invention provides for improved position resolution relative to existing position sensing devices operating under similar conditions and having the same size active areas. Position resolution is defined as the minimum light spot displacement on the detector surface that can be detected. Position resolution is dependent on a plurality of variables, including the size of the position sensing detectors, detector noise, light input intensity, and the bandwidth of the electronic circuits.

Position resolution can be calculated using equation (4).

$$\Delta L = L/(2*(S/N)) \quad (4)$$

where L is the active length of the position sensing detector and S/N is the signal to noise ratio. Given the specific context of the present invention, the signal to noise ratio can be further detailed, yielding an expression of equation (4) in the form of equations (5) and (6).

$$\Delta L = \frac{L}{2*(I_{photo})\over ((4*k*T*B)/R_{inter})+2*q*I*B)^{0.5}} \quad (5)$$

$$\Delta L = \frac{L*(((4*k*T*B)/R_{inter})+2*q*I*B)^{0.5}}{2*P_{inc}*R} \quad (6)$$

where k=1.38×10$^{-23}$ Joules per degree Kelvin (the Boltzmann Constant), T is the absolute temperature in degrees Kelvin, B is the bandwidth, in hertz, $R_{inter}$ is interelectrode resistance in ohms, q is the electron charge, 1.6×10$^{-19}$ C, I is the dark current in amps, $P_{inc}$ is the incident optical power of the light spot in watts, and R is the responsivity of the position sensing detector in amps divided by watts.

For example, a first InGaAs position sensing detector is comprised of a plurality of layers, including a conventional 200 μm thick n+ conductive InP substrate, having a resistivity of 0.001 Ω-cm and an active area of 3 mm×3 mm. A second InGaAs position sensing detector is compositionally similar, except that the substrate is semi-insulating. More specifically, both the first and second position sensing detector have 1) a p-type layer that is 0.5 μm thick with a doping concentration of 10$^{18}$ cm$^{-3}$ and a resistivity of 0.1 Ω-cm, 2) an InGaAs layer that is 4 μm thick with a doping concentration of 10$^{14}$ cm$^{-3}$ and 3) a n-type InP buffered layer that is 1.0 μm thick with a doping concentration of 10$^{16}$ cm$^{-3}$ and a resistivity of 0.2 Ω-cm.

Assuming the dark current, I, for both devices is 5 nA at operational voltage (the dark current should be equivalent because it substantially depends upon the characteristics of the InGaAs layer, which is the same for both devices), the optical power of the light spot is 10 μW, the responsivity value is 1.0 amps per watt at 1550 nm, and the operational bandwidth is 1 MHz, the position resolution for the first position sensing detector can be derived by first determining the anode-anode and cathode-cathode resistance. As one of ordinary skill in the art would understand how to calculate from equation (7), the resistance from anode-anode ($R_{anode-anode}$) is equal to 2 kΩ, where the resistivity, length, and area are of the p-type InP layer. The resistance from cathode-cathode ($R_{cathode-cathode}$) is equal to 0.05 Ω, where the resistivity, length, and area are of the n+ conductive substrate.

$$R=\text{Resistivity} \times \text{length/area} \quad (7)$$

Referring back to equation (6) and inserting the values for K, T, B, $R_{cathode-cathode}$, q, I, $P_{inc}$, and R, a position resolution for the first position sensing detector is calculated to be approximately 169 μm. The resolution is poor and is compromised by the low resistance value of the cathode-cathode interelectrode resistance.

Performing the same calculation for the second position sensing detector, the cathode-cathode resistance is substantially higher at 2 kΩ, where the resistivity, length, and area are of the n InP buffered layer because the substrate is semi-insulating. The higher $R_{cathode-cathode}$ yields a position resolution of 0.85 μm. Therefore, the second position sensing detector has a higher resolution than the first position sensing detector.

This novel structure of a position sensing detector sensing enables higher accuracy in the 1.3 to 1.55 micron wavelength region, while dark currents remain substantially low and reverse bias is easy to apply. Since modifications can be made in the above constructions without departing from the scope of the invention, it is intended that the matter described so far be interpreted as illustrative rather than restrictive. For example, semiconductor materials other than InGaAs or InP including silicon and germanium may be used. Also, different doping agents other than those mentioned above may be used while still preserving the diode structure and hence staying within the scope and intent of the present invention. The invention, therefore, should not be restricted, except to the following claims and their equivalents.

We claim:

1. A position sensing detector comprising:
   a semi-insulating substrate;
   a first semiconductor layer over the semi-insulating substrate;
   a second semiconductor layer over the first semiconductor layer;

a portion of the second semiconductor layer treated to form a mask region to create a p-n junction;

a first pair of electrodes electrically coupled to the first semiconductor layer; and a second pair of electrodes electrically coupled to the mask region of the second semiconductor layer.

2. The detector of claim 1 wherein the first pair of electrodes are spaced apart and parallel to each other.

3. The detector of claim 2 wherein the second pair of electrodes is disposed perpendicular to the first pair of electrodes.

4. The detector of claim 1 further including a trench extending through the second semiconductor layer to the first semiconductor layer, a passivation layer covering at least part of a wall of the trench, a conductor filled trench forming at least one electrode of the first pair of electrodes.

5. The detector of claim 1 wherein the semi-insulating substrate is InP having a thickness in a range of 50 micron to 1000 micron.

6. The detector of claim 1 wherein the first and second pairs of electrodes extend substantially to a common plane.

7. The detector of claim 1 wherein the detector is adapted to fit into a flip chip assembly.

8. The detector of claim 1 further including an interleaved semiconductor layer interposed between the first semiconductor layer and the second semiconductor layer, wherein the first semiconductor layer is a n-type doped InP having a thickness in a range of 0.1 micron to 1.0 micron and a doping concentration in a range of $1 \times 10^{15}$ atoms per cc to $1 \times 10^{18}$ atoms per cc, the interleaved semiconductor layer is a n-type doped InGaAs having a thickness of 1 to 6 microns and a doping concentration in a range of $1 \times 10^{13}$ to $1 \times 10^{16}$ atoms per cc, and the second semiconductor layer is a n-type doped InP having a thickness of 0.1 micron to 2 micron and a doping concentration in a range of $1 \times 10^{14}$ atoms per cc to $1 \times 10^{17}$ atoms per cc, wherein the portion of the second semiconductor layer is diffused to form a p-type region having a concentration in a range of $1 \times 10^{16}$ atoms per cc. to $1 \times 10^{19}$ atoms per cc.

9. The detector of claim 1 wherein the mask region is a p-region.

10. A position sensing detector comprising:

a semi-insulating semiconductor substrate including a top side;

a first semiconductor layer over the top side of the semi-insulating substrate;

a second semiconductor layer over the first semiconductor layer;

a third semiconductor layer over the second semiconductor layer;

a p-n junction between the second and third semiconductor layers;

a first pair of electrodes electrically coupled to the first semiconductor layer, the first pair of electrodes spaced apart and parallel to each other; and a second pair of electrodes electrically coupled to the third semiconductor layer, the second pair of electrodes spaced apart and parallel to each other, the second pair of electrodes disposed perpendicular to the first pair of electrodes.

11. The detector of claim 10 wherein the semi-insulating substrate is InP, the first layer is InP, the second layer is InGaAs, and the third layer is InP.

12. The detector of claim 11 including a trench extending through the third and second semiconductor layer for accessing the first semiconductor layer, a passivation layer covering at least part of a wall of the trench, a conductor filled trench forming at least one electrode of the first pair of electrodes.

13. The detector of claim 12 wherein the first, second and third semiconductor layers are n-dope type.

14. The detector of claim 13 wherein the semi-insulating substrate has a thickness in the range of 50 microns to 1000 microns, the first layer has a thickness in the range of 0.1 micron to 1 micron and a doping concentration in a range of $1 \times 10^{15}$ atoms per cc to $1 \times 10^{18}$ atoms per cc, the second layer has a thickness in the range of 1 micron to 6 microns and a doping concentration in a range of $1 \times 10^{13}$ atoms per cc to $1 \times 10^{16}$ atoms per cc, and the third layer has a thickness in the range of 0.1 micron to 2 microns and a doping concentration in a range of $1 \times 10^{14}$ atoms per cc to $1 \times 10^{17}$ atoms per cc, wherein a portion of the third semiconductor layer is diffused to form a p-region having a concentration in a range of $1 \times 10^{16}$ atoms per cc to $1 \times 10^{19}$ atoms per cc.

15. The detector of claim 10 wherein a portion of the third semiconductor layer is treated to form a p-region to create the p-n junction.

16. The detector of claim 15 wherein the p-region is formed by diffusing zinc.

17. The detector of claim 15 wherein the second pair of electrodes is electrically coupled to the p-region of the third semiconductor layer.

18. The detector of claim 10 wherein the first and second pairs of electrodes extend substantially to a common plane.

19. The detector of claim 10 further comprising an anti-reflection layer over at least part of the third semiconductor layer.

20. The detector of claim 10 wherein the semi-insulating substrate is InP, the first layer is InGaAs, the second layer is InGaAs, and the third layer InGaAs.

21. The detector of claim 10 wherein the second semiconductor layer partially covers over the first semiconductor layer, and wherein the second semiconductor layer is disposed between the first pair of electrodes electrically coupled with the first semiconductor layer.

22. The detector of claim 21 wherein the first semiconductor layer partially covers over the semi-insulating semiconductor substrate, the detector further comprising a passivation layer over at least part of the detector, and a first conductive extension electrically coupled to one of the electrode of the first pair of electrodes and disposed over the passivation layer and routed to the top side of the substrate.

23. The detector of claim 22 further comprising a second conductive extension electrically coupled to the other electrode of the first pair of electrodes and disposed over the passivation layer and routed to the top side of the substrate.

24. The position sensing detector comprising:

a substrate means;

a buffered layer means over the substrate means;

an absorption layer means over the buffered layer means;

a semiconductor layer means over the absorption layer means;

a p-n junction between the semiconductor layer means and the absorption layer means;

a first pair of electrodes coupled to the first buffered layer means; and a second pair of electrodes coupled to the semiconductor layer means.

* * * * *